(12) United States Patent
Boettiger et al.

(10) Patent No.: US 9,269,743 B2
(45) Date of Patent: Feb. 23, 2016

(54) METHODS OF FORMING IMAGING DEVICE LAYERS USING CARRIER SUBSTRATES

(71) Applicant: Semiconductor Components Industries, LLC, Phoenix, AZ (US)

(72) Inventors: Ulrich Boettiger, Garden City, ID (US); Swarnal Borthakur, Boise, ID (US); Andrew Perkins, Boise, ID (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 50 days.

(21) Appl. No.: 14/086,336

(22) Filed: Nov. 21, 2013

(65) Prior Publication Data

US 2015/0137297 A1  May 21, 2015

(51) Int. Cl.
*H01L 27/146* (2006.01)

(52) U.S. Cl.
CPC .... *H01L 27/14685* (2013.01); *H01L 27/14621* (2013.01)

(58) Field of Classification Search
CPC ................. H01L 27/14621; H01L 27/14683; H01L 27/14685; H01L 27/14627; H01L 31/1892
See application file for complete search history.

(56) References Cited

U.S. PATENT DOCUMENTS

| | | |
|---|---|---|
| 5,654,811 A | 8/1997 | Spitzer et al. |
| 7,153,618 B2 | 12/2006 | Kim et al. |
| 8,017,426 B2 | 9/2011 | Brady |
| 2008/0057186 A1* | 3/2008 | Kim .............................. 427/167 |
| 2010/0210055 A1* | 8/2010 | Yoon et al. ....................... 438/30 |
| 2011/0024642 A1* | 2/2011 | Tredwell et al. .......... 250/370.09 |
| 2013/0010165 A1* | 1/2013 | Yu ................................. 348/273 |
| 2013/0037838 A1 | 2/2013 | Speier et al. |

FOREIGN PATENT DOCUMENTS

EP  0659282  11/1998

* cited by examiner

*Primary Examiner* — Mohsen Ahmadi
*Assistant Examiner* — Stephen Bradley
(74) *Attorney, Agent, or Firm* — Treyz Law Group, P.C.

(57) ABSTRACT

An array of color filter elements may be formed over an array of photodiodes in an integrated circuit for an imaging device using a carrier substrate. The carrier substrate may have a planar surface with a release layer. A layer of color filter material may be applied to the release layer. The carrier substrate may then be flipped and the layer of color filter material may be bonded to the integrated circuit. Heat may be applied to activate the release layer and the carrier substrate may be removed at the interface between the release layer and the color filter material. The layer of color filter material may be patterned either before bonding the layer of color filter material or after the carrier substrate is removed. A layer of microlenses may be formed over the array of color filter elements using a carrier substrate.

8 Claims, 5 Drawing Sheets

METHODS OF FORMING IMAGING DEVICE LAYERS USING CARRIER SUBSTRATES

BACKGROUND

This relates generally to imaging systems, and more particularly, to imaging systems with imaging device layers formed using carrier substrates.

Modern electronic device such as cellular telephones, cameras, and computers often use digital image sensors. Imagers (i.e., image sensors) often include a two-dimensional array of image sensing pixels. Each pixel typically includes a photosensor such as a photodiode that receives incident photons (light) and converts the photons into electrical signals. An image sensor contains an imaging device integrated circuit containing an array of photodiodes. An image sensor often also includes one or more imaging device layers over the array of photodiodes. For example, an imaging device layer such as a layer formed from color filter material is conventionally formed directly on the imaging device integrated circuit over the array of photodiodes using conventional spin coating techniques. However, the non-planar topography of the imaging device integrated circuit may result in the production of color filters arrays that do not meet desired performance criteria (for example, color filter arrays with streaks or waves due to non-uniform coating).

It would therefore be desirable to provide improved ways of forming imaging device layers over imaging device integrated circuits in imaging systems.

DETAILED DESCRIPTION

Electronic devices such as digital cameras, computers, cellular telephones, and other electronic devices include image sensors that gather incoming image light to capture an image. The image sensors may include arrays of imaging pixels. The pixels in the image sensors may include photosensitive elements such as photodiodes that convert the incoming image light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the imaging pixels and readout circuitry for reading out image signals corresponding to the electric charge generated by the photosensitive elements.

Figure 1:
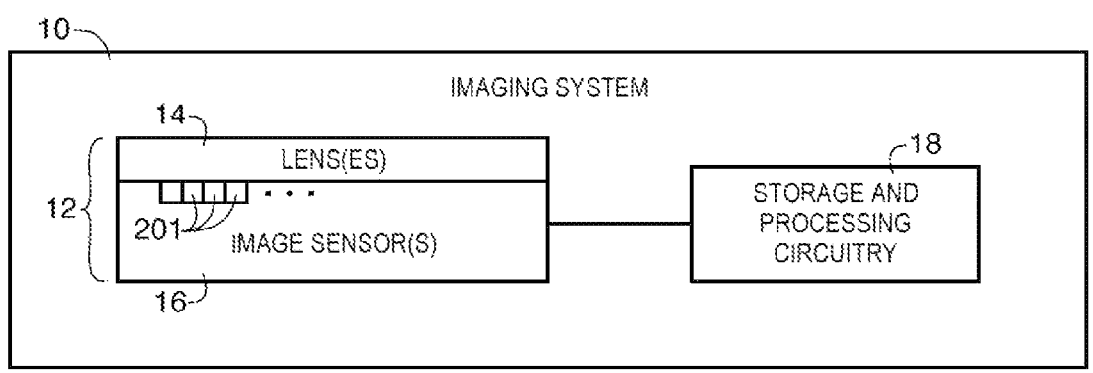
FIG. 1 is a diagram of an illustrative imaging system that may include a camera module having an image sensor in accordance with an embodiment of the present invention.

FIG. 1 is a diagram of an illustrative electronic device that uses an image sensor to capture images. Electronic device 10 of FIG. 1 may be a portable electronic device such as a camera, a cellular telephone, a video camera, or other imaging device that captures digital image data. Camera module 12 may be used to convert incoming light into digital image data. Camera module 12 may include one or more lenses 14 and one or more corresponding image sensors 16. During image capture operations, light from a scene may be focused onto image sensor 16 by lens 14. Image sensor 16 provides corresponding digital image data to processing circuitry 18. If desired, camera module 12 may be provided with an array of lenses 14 and an array of corresponding image sensors 16. Image sensor 16 may include an array of image sensor pixels having an array of photosensitive elements such as photosensitive elements 201 (sometimes referred to as photodiodes 201) and a corresponding array of color filter elements.

Processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18. Processed image data may, if desired, be provided to external equipment (e.g., a computer or other device) using wired and/or wireless communications paths coupled to processing circuitry 18.

Figure 2:
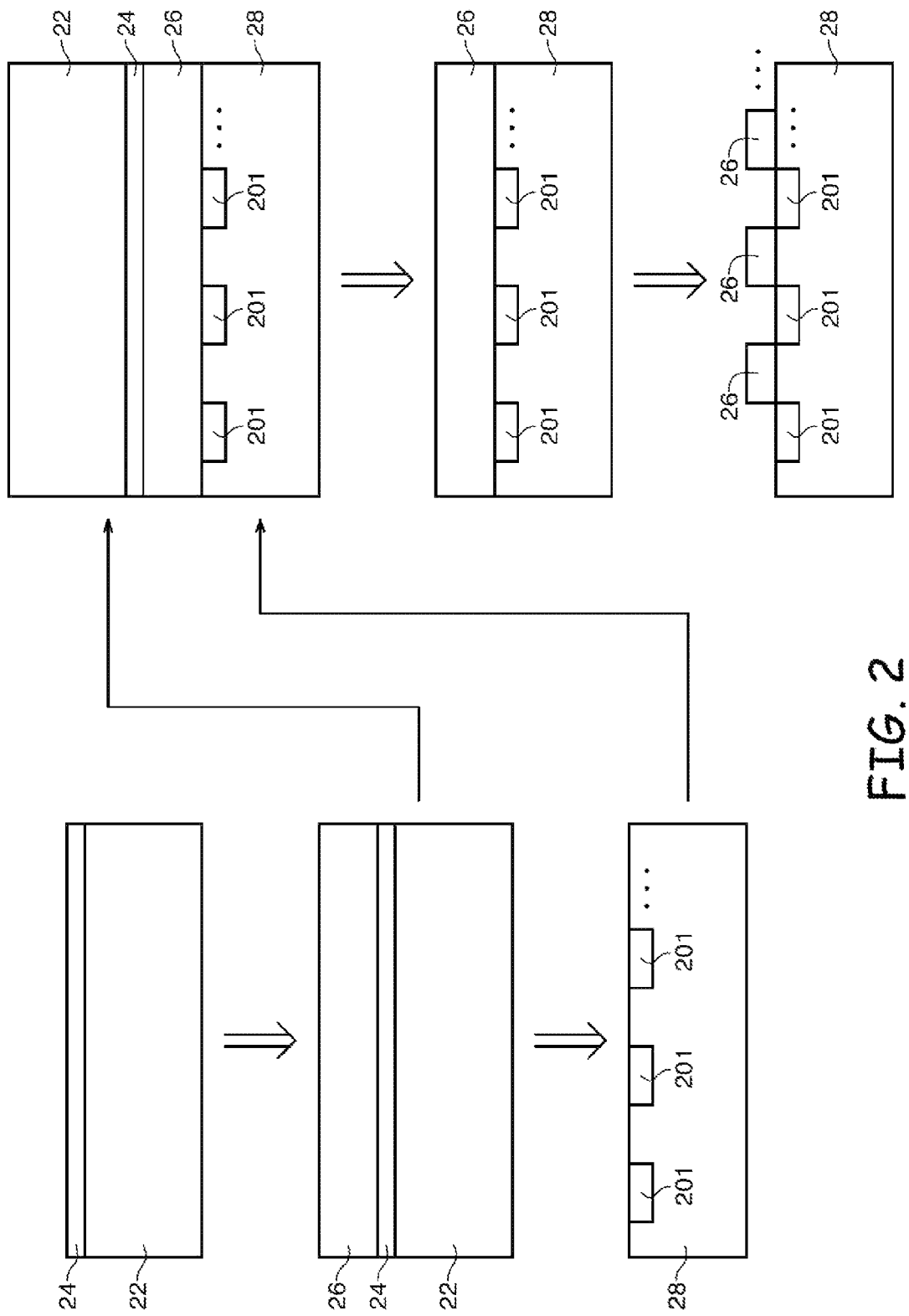
FIG. 2 is a diagram showing illustrative steps that may be involved in forming an imaging device layer using a carrier substrate in accordance with an embodiment of the present invention.

As shown in FIG. 2, an imaging device layer such as imaging device layer 26 may be formed on a carrier substrate such as carrier substrate 22 before being formed over an array of photodiodes 201. Carrier substrate 22 may have a planar surface that is coated or laminated with a release layer such as release layer 24. Carrier substrate 22 may be formed from silicon, glass, or any other material suitable for having a planar surface coated with a release layer. Release layer 24 may be formed from a wax-based material, water soluble polymer, a tape (e.g. release tape), or any other material suitable for adhering to carrier substrate 22 while temporarily adhering to an imaging device layer.

Imaging device layer 26 may be on release layer 24 over the planar surface of carrier substrate 22. Imaging device layer 26 may be formed from color filter material and may be coated or laminated on release layer 24 in a liquid form. Heat and pressure may be applied to imaging device layer 26 to harden or solidify the imaging device layer and promote adhesion to release layer 24. Carrier substrate 22 including release layer 24 and imaging device layer 26 may be soft baked using a heating device (e.g. a hot plate), or heat may be selectively applied to imaging device layer 26 and at the interface of imaging device layer 26 and release layer 24 (e.g. using a laser). The amount of heat applied in the soft bake is below the threshold activation heat of the release layer. For example, if the threshold activation heat/temperature of the release layer is around 120° C., the imaging device layer may be heated to a temperature below 120° C. (e.g. around 90° C.) to harden the imaging device layer and adhere the imaging device layer to the release layer. The threshold of activation for the release layer may be 90 to 180° C. The soft bake temperature may be below 180° C., below 90° C., between 75 and 120° C., or any suitable temperature for bonding the imaging device layer to the release layer without activating (e.g. melting) the release layer.

Forming the imaging device layer on release layer 24 over a planar surface of carrier substrate 22 allows imaging device layer 26 to be formed on a planar surface rather than on a surface of uneven (i.e. non-planar) topography (e.g. an imaging device integrated circuit with circuitry and photodiodes). This may eliminate the need for a planarization step of imaging device layer 26 (and associated planarization equipment), increase coating uniformity of the imaging device layer, and reduce defects in formation of the imaging device layer (e.g. imaging device layer 26 may be free of streaks and waves or any other deformations that may cause imaging devices to fail performance standards).

An array of photodiodes 201 may be formed in an imaging device integrated circuit such as imaging device integrated circuit 28. Regions of imaging device integrated circuit 28 may be cleaned to be free of dust and other contaminants (e.g. wet clean using a suitable plasma or dry clean using oxygen) and primed with a surface adhesion promoter in preparation for bonding with imaging device layer 26 on carrier substrate 22.

Carrier substrate 22 may be flipped such that imaging device layer 26 faces imaging device integrated circuit 28. Imaging device layer 26 may be placed in contact with (i.e. bonded to) imaging device integrated circuit 28 and formed over photodiodes 201 in imaging device integrated circuit 28. Release layer 24 and imaging device layer 26 may have a controlled amount of compliance to facilitate void free bonding between imaging device layer 26 and imaging device integrated circuit 28. An optional additional compliant layer may be interposed between carrier substrate 22 and release layer 24. Bonding of imaging device layer 26 and imaging device integrated circuit 28 may optionally occur in a vacuum to avoid forming voids during the bonding of imaging device layer 26 with imaging device integrated circuit 28. Bonding of imaging device layer 26 and imaging device integrated circuit 28 may optionally occur in a solvent atmosphere. There may be intermediate circuitry and additional layers interposed between imaging device layer 26 and photodiodes 201 in imaging device integrated circuit 28.

Heat may be applied either to the entire bonded structure (i.e. the flipped carrier substrate 22 bonded to imaging device integrated circuit 28) or selectively applied to the interface between imaging device layer 26 and imaging device integrated circuit 28. The amount of heat applied to bond imaging device layer 26 to imaging device integrated circuit 28 is below the threshold activation heat of the release layer. For example, if the threshold activation heat/temperature of the release layer is around 120° C., the imaging device layer may be heated to a temperature below 120° C. (e.g. around 90° C.) to harden the imaging device layer and adhere imaging device layer 26 to imaging device integrated circuit 28. The threshold of activation for the release layer may be 90 to 180° C. The temperature of imaging device layer while being formed over imaging device integrated circuit 28 may be below 180° C., below 90° C., between 75 and 120° C., or any suitable temperature for bonding the imaging device layer to imaging device integrated circuit 28 without activating (e.g. melting) the release layer.

After imaging device layer 26 is bonded to imaging device integrated circuit 28, carrier substrate 22 may be removed by applying heat to activate release layer 24. Heat may be applied to the entire bonded structure (i.e. the flipped carrier substrate 22 bonded to imaging device integrated circuit 28) or may be selectively applied to the interface between release layer 24 and imaging device layer 26. Heat may be applied directly using a heat source (e.g. a hot plate) or may be applied using light to heat (LTH) conversion if carrier substrate 22 is transparent (e.g. formed from glass). The amount of heat applied to activate (e.g. soften, liquefy, or melt) release layer 24 and remove carrier substrate 22 from imaging device integrated circuit 28 may be equal to or above the threshold activation heat/temperature of release layer 24. For example, heat may be applied such that the release melts (e.g. liquefies) enough to be easily removed from imaging device layer 26 without damaging the imaging device layer 26. The threshold of activation for release layer 24 may vary depending on the material of the release layer and may be from 90 to 180° C.

After the removal of carrier substrate 22 (including release layer 24), the top surface of imaging device layer 26 may be cleaned to remove any residues remaining from the removal of release layer 24. Imaging device layer 26 may then be patterned while formed over imaging device integrated circuit 28 using any suitable patterning techniques and equipment (e.g. photolithography and etching techniques) to form an array of color filter elements 26 properly aligned over photodiodes 201.

Figure 3:
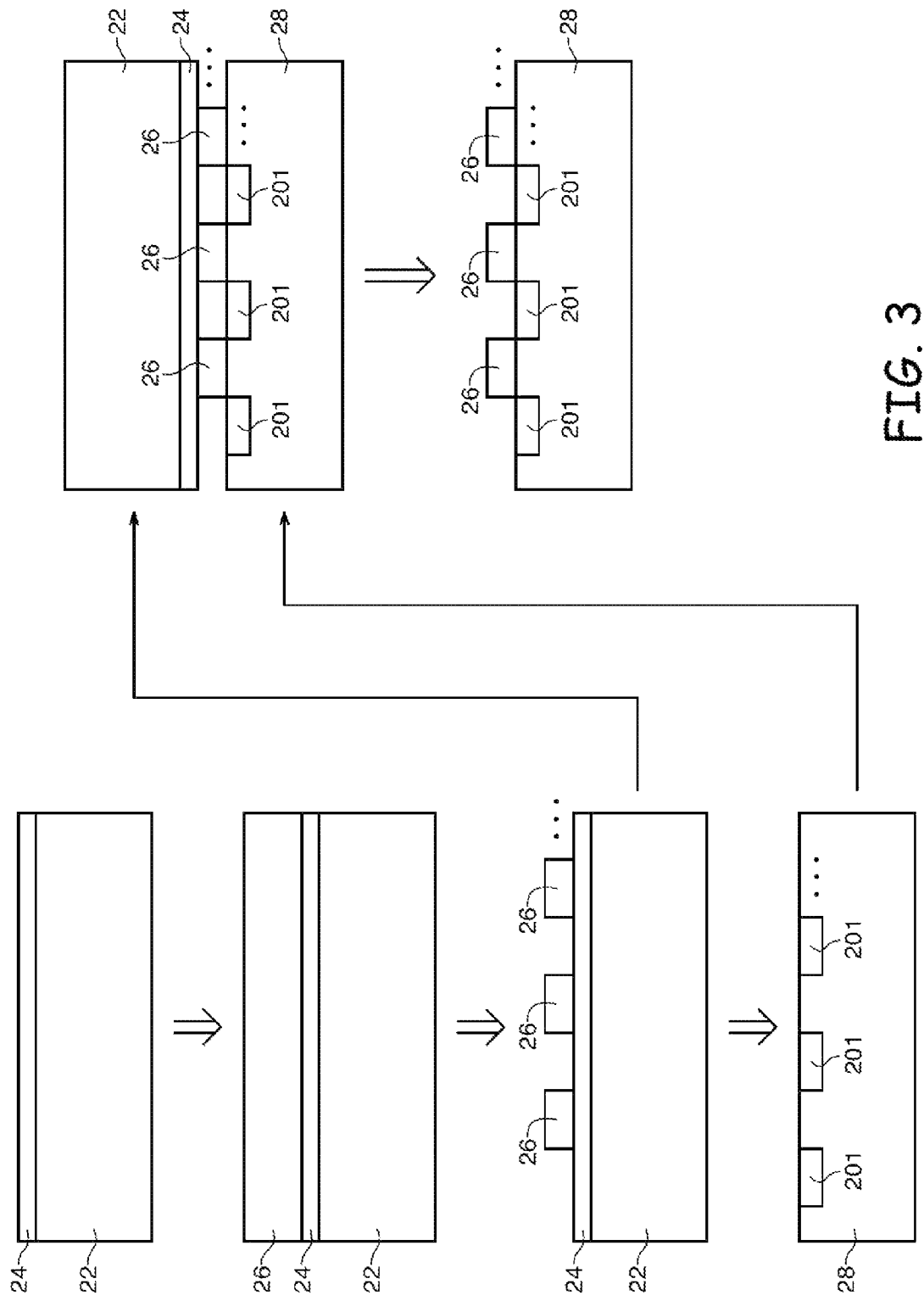
FIG. 3 is a diagram showing illustrative steps that may be involved in forming an imaging device layer using a carrier substrate in accordance with an embodiment of the present invention.

As shown in FIG. 3, imaging device layer 26 may be patterned on carrier substrate 22 before imaging device layer 26 is formed over the array of photodiodes 201 in imaging device integrated circuit 28. For example, instead of patterning imaging device layer 26 after forming imaging device layer 26 over imaging device integrated circuit 28, imaging device layer 26 may be patterned while bonded to carrier substrate 22 (prior to being formed over imaging device integrated circuit 28). Imaging device layer 26 may be patterned using any suitable patterning techniques and equipment (e.g. photolithography or etching) to form an array of color filter elements 26.

An array of photodiodes 201 may be formed in an imaging device integrated circuit such as imaging device integrated circuit 28. Imaging device layer 26 may be patterned to have a pattern that corresponds to the pattern of the array of photodiodes 201 in imaging device integrated circuit 28. Imaging device layer 26 may be patterned to accommodate manufacturing variations in photodiodes 201 (e.g. the pattern of the array of color filter elements 26 may be pre-distorted to accommodate possible distortions in the pattern of the array of photodiodes 201 and to improve matching between the patterns of the array of color filter elements 26 and the array of photodiodes 201). Regions of imaging device integrated circuit 28 may be cleaned to be free of dust and other contaminants (e.g. wet clean using a suitable plasma or dry clean using oxygen) and primed with a surface adhesion promoter in preparation for bonding with patterned imaging device layer 26 on carrier substrate 22.

Carrier substrate 22 may then be flipped such that the array of color filter elements 26 are aligned with photodiodes 201 in imaging device integrated circuit 28. Alignment equipment may be configured to align each color filter element 26 with a respective photodiode 201 with an alignment accuracy of less than 100 nm, less than 300 nm, or between 90-300 nm (as examples). Patterned imaging device layer 26 (an array of color filter elements 26) may then be placed in contact with (i.e. bonded to) imaging device integrated circuit 28. There may be intermediate circuitry and additional layers interposed between imaging device layer 26 and photodiodes 201 in imaging device integrated circuit 28. Heat may be applied either to the entire bonded structure (i.e. the flipped carrier substrate 22 bonded to imaging device integrated circuit 28) or selectively applied to the interface between imaging device layer 26 and imaging device integrated circuit 28.

After patterned imaging device layer 26 (also referred to as an array of color filter elements 26) is bonded to imaging device integrated circuit 28, carrier substrate 22 may be removed by applying heat to activate release layer 24 and the top surface of the array of color filter elements 26 may be cleaned to remove any residues remaining from the removal of release layer 24, as described in connection with FIG. 2.

After an array of color filter elements 26 are formed over photodiodes 201 using, for example, either one of the processes described in connection with FIGS. 2 and 3 and the carrier substrate 22 is removed, the processes of FIGS. 2 and 3 may be repeated to form additional arrays of color filter elements. For example, an array of red color filter elements may be formed first (using either process described in connection with FIGS. 2 and 3), followed by a formation of an array of blue color filter elements formed by either process, then a formation of an array of green color filter elements formed by either process to form a Bayer color filter array. This is merely illustrative; any order of forming color filter elements of different types may be used.

Additionally, microlenses may be formed over color filter elements using the process described in connection with FIG. 2 with a layer of microlens material as imaging device layer 26. For example, a layer of microlens material may be deposited on release layer 24 over a planar surface of carrier substrate 22. Heat may be applied to bond the microlens material layer to the release layer. The carrier substrate may then be flipped over such that the microlens material layer faces the array of color filter elements 26 on imaging device integrated circuit 28. Heat may be applied to the microlens material layer to form the microlens material layer over the array of color filter elements 26. The carrier substrate may be removed at the interface between the release layer and the microlens material layer and the microlens material layer may be patterned to form an array of microlenses over the array of color filter elements. The same carrier substrate or different carrier substrates may be used for forming different arrays of color filter elements and microlenses.

Figure 4:
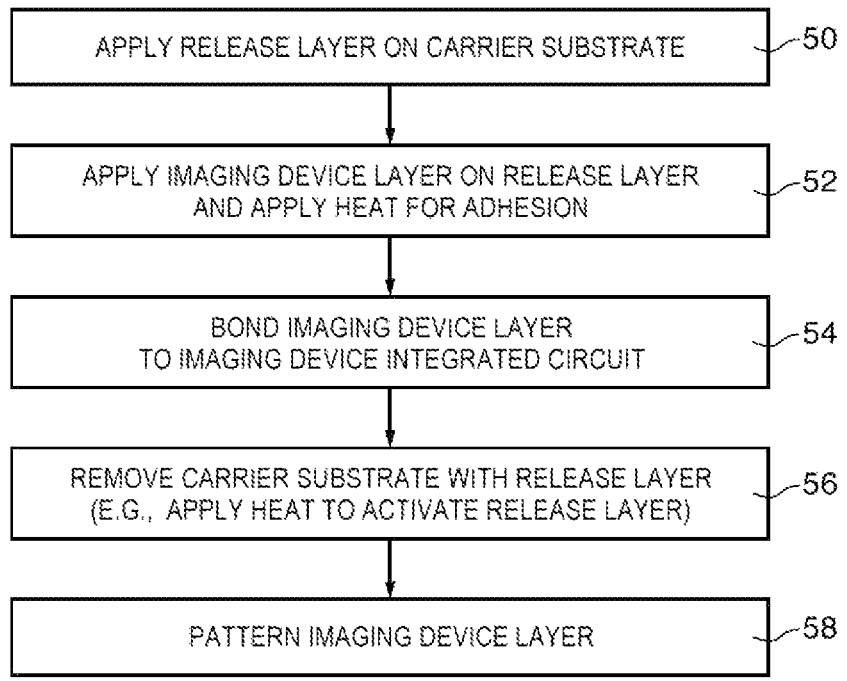
FIG. 4 is a flow chart showing illustrative steps that may be involved in forming an imaging device layer using a carrier substrate corresponding to FIG. 2 in accordance with an embodiment of the present invention.

FIG. 4 is a flowchart of steps for forming an imaging device layer over a photodiode array in an image sensor using a carrier substrate corresponding to FIG. 2.

At step 50, a release layer such as release layer 24 may be applied to a surface of carrier substrate such as carrier substrate 22. The release layer may be coated or laminated on carrier substrate 22. Carrier substrate 22 may be formed from silicon, glass, or any other material suitable for having a planar surface coated with a release layer. Release layer 24 may be formed from a wax-based material, water soluble polymer, a tape (e.g. release tape), or any other material suitable for adhering to carrier substrate 22 while temporarily adhering to an imaging device layer.

At step 52 an imaging device layer such as imaging device layer 26 may be applied on the release layer on a planar surface of the carrier substrate. Imaging device layer 26 may be applied as color filter material in liquid form. Heat and pressure may be applied to imaging device layer 26 to harden or solidify the imaging device layer and promote adhesion to release layer 24. Heat may be applied either to the entire bonded structure or selectively in regions near the interface between imaging device layer 26 and release layer 24. The amount of heat applied in the soft bake is below the threshold activation heat of the release layer.

At step 54, the imaging device layer such as imaging device layer 26 may be bonded to an imaging device integrated circuit such as imaging device integrated circuit 28. Regions of imaging device integrated circuit 28 may be cleaned to be free of dust and other contaminants (e.g. wet clean using a suitable plasma or dry clean using oxygen) and primed with a surface adhesion promoter in preparation for assembly (e.g. bonding) with imaging device layer 26 on carrier substrate 22. Carrier substrate 22 may be flipped such that imaging device layer 26 faces imaging device integrated circuit 28 and imaging device layer may be bonded to imaging device integrated circuit 28. Release layer 24 and imaging device layer 26 may have a controlled amount of compliance to facilitate void free bonding between imaging device layer 26 and imaging device integrated circuit 28. An optional additional compliant layer may be interposed between carrier substrate 22 and release layer 24. Bonding of imaging device layer 26 and imaging device integrated circuit 28 may optionally occur in a vacuum to avoid forming voids during the bonding of imaging device layer 26 with imaging device integrated circuit 28. Bonding of imaging device layer 26 and imaging device integrated circuit 28 may optionally occur in a solvent atmosphere. Heat may be applied either to the entire bonded structure (i.e. the flipped carrier substrate 22 bonded to imaging device integrated circuit 28) or selectively applied to the interface between imaging device layer 26 and imaging device integrated circuit 28. The amount of heat applied to bond imaging device layer 26 to imaging device integrated circuit 28 is below the threshold activation heat of the release layer.

At step 56, the carrier substrate such as carrier substrate 22 including its release layer such as release layer 24 may be removed by applying heat to activate release layer 24. Heat may be applied to the entire bonded structure (i.e. the flipped carrier substrate 22 bonded to imaging device integrated circuit 28) or may be selectively applied to the interface between release layer 24 and imaging device layer 26. Heat may be applied directly using a heat source (e.g. a hot plate) or may be applied using light to heat (LTH) conversion if carrier substrate 22 is transparent (e.g. formed from glass). The amount of heat applied to activate (e.g. soften, liquefy, or melt) release layer 24 and remove carrier substrate 22 from imaging device integrated circuit 28 may be at or above the threshold activation heat/temperature of release layer 24. After the removal of carrier substrate 22 (including release layer 24), the top surface of imaging device layer 26 may be cleaned to remove any residues remaining from the removal of release layer 24.

At step 58, the imaging device layer such as imaging device layer 26 may be patterned while formed over imaging device integrated circuit 28 using any suitable patterning techniques and equipment (e.g. photolithography and etching techniques) to form an array of color filter elements 26 properly aligned over photodiodes 201.

Figure 5:
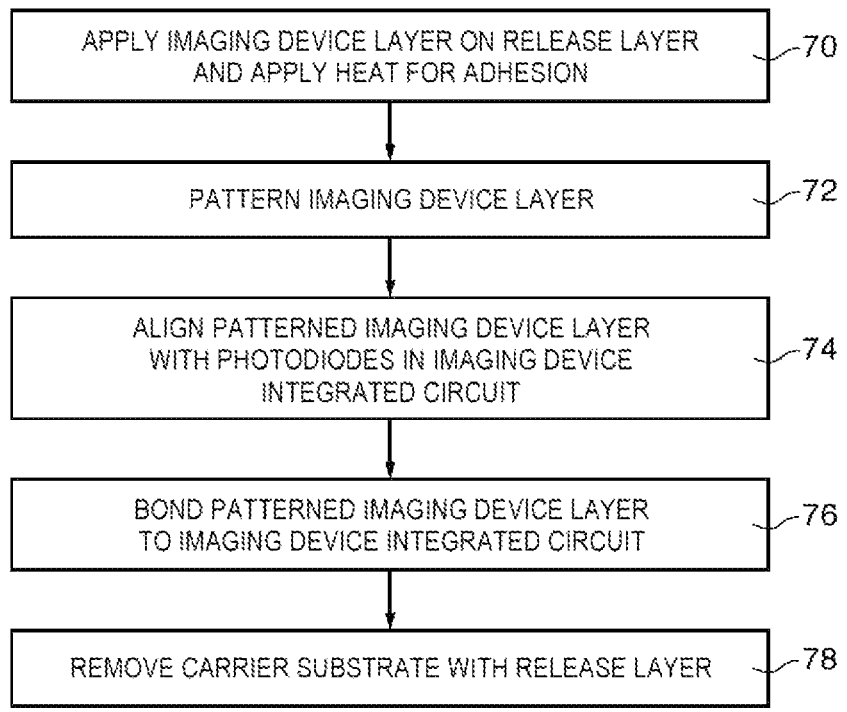
FIG. 5 is a flow chart showing illustrative steps that may be involved in forming an imaging device layer using a carrier substrate corresponding to FIG. 3 in accordance with an embodiment of the present invention.

FIG. 5 is a flowchart of steps for forming an imaging device layer over an array of photodiodes in an image sensor using a carrier substrate corresponding to FIG. 3.

At step 70, an imaging device layer such as imaging device layer 26 may be applied on a release layer such as release layer 24 on a planar surface of a carrier substrate such as carrier substrate 22. Imaging device layer 26 may be applied as color filter material in liquid form. Heat and pressure may be applied to imaging device layer 26 to harden or solidify the imaging device layer and promote adhesion to release layer 24. Heat may be applied either to the entire bonded structure or selectively in regions near the interface between imaging device layer 26 and release layer 24. The amount of heat applied in the soft bake is below the threshold activation heat of the release layer.

At step 72, an imaging device layer such as imaging device layer 26 may be patterned on carrier substrate 22 before the imaging device layer is bonded to imaging device integrated circuit 28. For example, instead of patterning imaging device layer 26 after bonding imaging device layer 26 to imaging device integrated circuit 28 and removing carrier substrate 22 from imaging device layer 26, imaging device layer 26 may be patterned while bonded to carrier substrate 22 (prior to being formed over imaging device integrated circuit 28). Imaging device layer 26 may be patterned using any suitable patterning techniques and equipment (e.g. photolithography or etching) to form an array of color filter elements 26. Imaging device layer 26 may be patterned to have a pattern that corresponds to the pattern of the array of photodiodes 201 in imaging device integrated circuit 28. Imaging device layer 26 may be patterned to accommodate manufacturing variations in photodiodes 201 (e.g. imaging device layer 26 may be pre-distorted to accommodate possible distortions in the array of photodiodes 201 to improve matching between the patterns of the array of color filter elements 26 and the array of photodiodes 201).

At step 74, carrier substrate 22 may be flipped such that patterned imaging device layer 26 faces imaging device integrated circuit 28 and the patterned imaging device layer (e.g. array of color filter elements 26) may be aligned with photodiodes 201 in imaging device integrated circuit 28. Alignment equipment may be configured to align each color filter element 26 with a respective photodiode 201 with an alignment accuracy of less than 100 nm, less than 300 nm, or between 90-300 nm (as examples).

At step 76, imaging device layer may be bonded to imaging device integrated circuit 28. Regions of imaging device integrated circuit 18 may be cleaned to be free of dust and other contaminants (e.g. wet clean using a suitable plasma or dry clean using oxygen) and primed with a surface adhesion promoter in preparation for bonding with patterned imaging device layer 26 on carrier substrate 22. Release layer 24 and imaging device layer 26 may have a controlled amount of compliance to facilitate void free bonding between imaging device layer 26 and imaging device integrated circuit 28. An optional additional compliant layer may be interposed between carrier substrate 22 and release layer 24. Bonding of imaging device layer 26 and imaging device integrated circuit 28 may optionally occur in a vacuum to avoid forming voids during the bonding of imaging device layer 26 with imaging device integrated circuit 28. Bonding of imaging device layer 26 and imaging device integrated circuit 28 may optionally occur in a solvent atmosphere. Heat may be applied either to the entire bonded structure (i.e. the flipped carrier substrate 22 bonded to imaging device integrated circuit 28) or selectively applied to the interface between imaging device layer 26 and imaging device integrated circuit 28. There may be intermediate circuitry and additional layers interposed between imaging device layer 26 and photodiodes 201 in imaging device integrated circuit 28.

At step 78, the carrier substrate such as carrier substrate 22 including its release layer such as release layer 24 may be removed by applying heat such that the release layer is activated and able to be easily separated from the imaging device layer such that the imaging device layer is not damaged. The imaging device layer may be cleaned to remove any residues left from removal of release layer 24.

Figure 6:
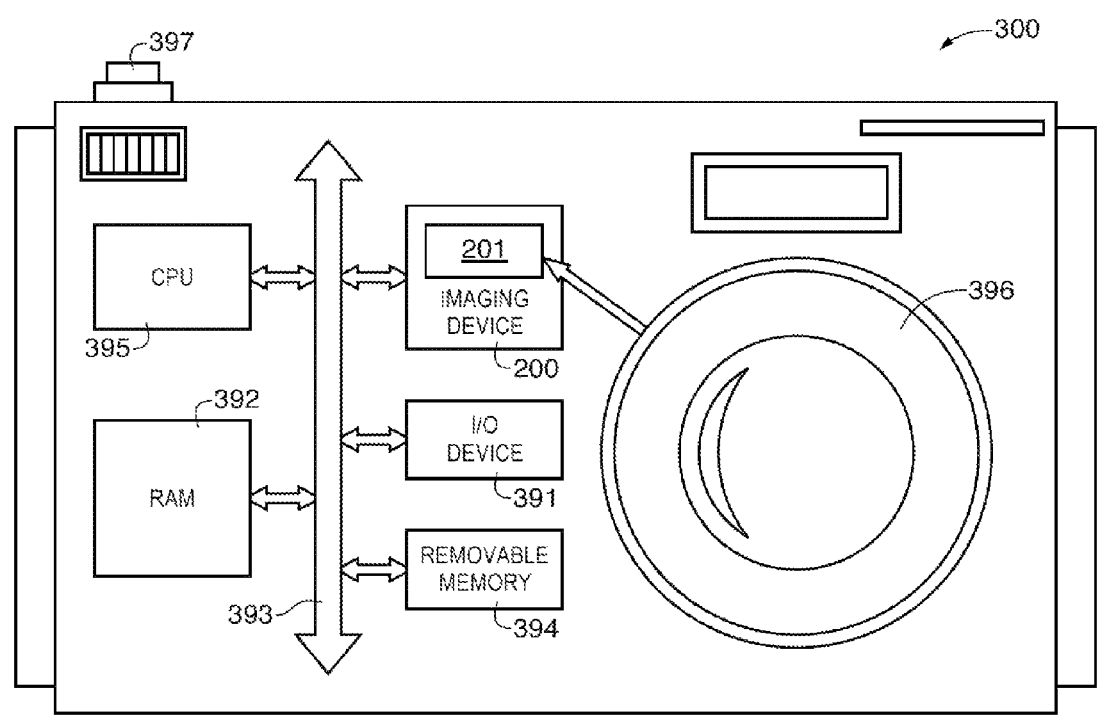
FIG. 6 is a block diagram of a system employing the embodiments of FIGS. 1-5 in accordance with an embodiment of the present invention.

FIG. 6 shows in simplified form a typical processor system 300, such as a digital camera, which includes an imaging device 200. Imaging device 200 may include an array of pixels including photodiodes 201 with imaging device layers such as an array of color filter elements formed over the pixel array as shown in FIGS. 2 and 3. Processor system 300 is exemplary of a system having digital circuits that may include imaging device 200. Without being limiting, such a system may include a computer system, still or video camera system, scanner, machine vision, vehicle navigation, video phone, surveillance system, auto focus system, star tracker system, motion detection system, image stabilization system, and other systems employing an imaging device.

Processor system 300, which may be a digital still or video camera system, may include a lens such as lens 396 for focusing an image onto a pixel array such as pixel array 201 when shutter release button 397 is pressed. Processor system 300 may include a central processing unit such as central processing unit (CPU) 395. CPU 395 may be a microprocessor that controls camera functions and one or more image flow functions and communicates with one or more input/output (I/O) devices 391 over a bus such as bus 393. Imaging device 200 may also communicate with CPU 395 over bus 393. System 300 may include random access memory (RAM) 392 and removable memory 394. Removable memory 394 may include flash memory that communicates with CPU 395 over bus 393. Imaging device 200 may be combined with CPU 395, with or without memory storage, on a single integrated circuit or on a different chip. Although bus 393 is illustrated as a single bus, it may be one or more buses or bridges or other communication paths used to interconnect the system components.

Various embodiments have been described illustrating imaging systems having an imaging device layer such as an array of color filter elements formed using a carrier substrate. An array of color filter elements may be formed over an imaging device integrated circuit including an array of photodiodes in an imaging device by depositing a layer of color filter material on a planar surface of a carrier substrate, bonding the layer of color filter material to the imaging device integrated circuit, and while the layer of color filter material is bonded to the imaging device integrated circuit, removing the carrier substrate from the layer of color filter material. The carrier substrate may have a release layer on its planar surface. The layer of color filter material may be heated to adhere to the release layer.

The carrier substrate may be flipped such that the color filter material layer faces the imaging device integrated circuit. The color filter material layer may then be placed in contact with the imaging device integrated circuit and heated to bond to the imaging device integrated circuit.

By applying an amount of heat that is equal to or greater than a threshold of activation for the release layer, the carrier substrate may be removed at the interface between the release layer and the imaging device layer while the imaging device layer is formed over the imaging device integrated circuit. The imaging device layer may be patterned after the carrier substrate is removed to form an array of color filter elements over the array of photodiodes on the imaging device integrated circuit.

Alternatively, the imaging device layer may be patterned to form an array of color filter elements prior to bonding the imaging device layer to the imaging device integrated circuit. The pattern of the array of color filter elements may be pre-distorted to accommodate manufacturing variations in the pattern of the array of photodiodes. The array of color filter elements may be aligned to the array of photodiodes in the imaging device integrated circuit and then bonded to the imaging device integrated circuit. The carrier substrate may be then removed at the interface between the release layer and the imaging device layer by applying an amount of heat that is equal to or greater than a threshold of activation for the release layer.

A microlens material layer may be deposited on an additional release layer bonded to a planar surface of an additional carrier substrate. Heat may be applied to bond the microlens material layer to the additional release layer. The microlens material layer may be placed in contact with the array of color filter elements and heated to bond to the array of color filter elements. The carrier substrate may be removed at the interface between the release layer and the microlens material layer and the microlens material layer may be patterned to form an array of microlenses over the array of color filter elements.

The foregoing is merely illustrative of the principles of this invention which can be practiced in other embodiments.

What is claimed is:

1. A method of forming an array of color filter elements over an imaging device integrated circuit including an array of photodiodes in an imaging device, comprising:
    depositing a layer of color filter material on a planar surface of a carrier substrate;
    bonding the layer of color filter material to the imaging device integrated circuit;
    while the layer of color filter material is bonded to the imaging device integrated circuit, removing the carrier substrate from the layer of color filter material; and
    after removing the carrier substrate from the layer of color filter material, patterning the layer of color filter material to form the array of color filter elements on the integrated circuit.

2. The method of claim 1, wherein the carrier substrate has a release layer.

3. The method of claim 2, further comprising:
    after depositing the layer of color filter material on the planar surface of the carrier substrate, heating the layer of color filter material such that the layer of color filter material adheres to the release layer.

4. The method of claim 3, further comprising:
    after heating the layer of color filter material such that the layer of color filter material adheres to the release layer, flipping the carrier substrate such that the layer of color filter material faces the imaging device integrated circuit, wherein bonding the layer of color filter material to the imaging device integrated circuit comprises bonding the layer of color filter material to the imaging device integrated circuit after the carrier substrate is flipped.

5. The method of claim 4, wherein removing the carrier substrate comprises applying an amount of heat to the release layer, wherein the amount of heat applied is equal to or greater than a threshold of activation for the release layer.

6. The method of claim 4, wherein removing the carrier substrate comprises removing the release layer and the carrier substrate at the interface between the release layer and the layer of color filter material.

7. A method of forming an imaging device, comprising:
    depositing a color filter material layer over a release layer that is bonded to a planar surface of a carrier substrate;
    applying heat to bond the color filter material layer to the release layer;
    placing the color filter material layer in contact with an imaging device integrated circuit of the imaging device, wherein the imaging device integrated circuit comprises an array of photosensitive elements;
    applying heat to the color filter material layer to bond the color filter material layer to the imaging device integrated circuit;
    removing the carrier substrate at the interface between the release layer and the color filter material layer; and
    patterning the color filter material layer to form an array of color filter elements, subsequent to removing the carrier substrate.

8. The method of claim 7, wherein removing the carrier substrate at the interface between the release layer and the color filter material layer comprises removing the carrier substrate at the interface between the release layer and the color filter material layer.

* * * * *